US010981193B2

(12) United States Patent
Lee (10) Patent No.: US 10,981,193 B2
(45) Date of Patent: Apr. 20, 2021

(54) DEPOSITING OF MATERIAL BY SPRAYING PRECURSOR USING SUPERCRITICAL FLUID

(71) Applicant: Nova Engineering Films, Inc., Los Altos Hills, CA (US)

(72) Inventor: Sang In Lee, Los Altos Hills, CA (US)

(73) Assignee: Nova Engineering Films, Inc., Los Altos Hills, CA (US)

( * ) Notice: Subject to any disclaimer, the term of this patent is extended or adjusted under 35 U.S.C. 154(b) by 0 days.

(21) Appl. No.: 15/942,205

(22) Filed: Mar. 30, 2018

(65) Prior Publication Data

US 2018/0290171 A1    Oct. 11, 2018

Related U.S. Application Data

(60) Provisional application No. 62/482,128, filed on Apr. 5, 2017.

(51) Int. Cl.
*H05H 1/24* (2006.01)
*B05D 1/02* (2006.01)
(Continued)

(52) U.S. Cl.
CPC .............. *B05D 1/025* (2013.01); *B05B 7/16* (2013.01); *B05D 3/142* (2013.01); *B05D 3/145* (2013.01); *C23C 18/1287* (2013.01); *C23C 18/14* (2013.01); *H05H 1/00* (2013.01); *H05H 1/42* (2013.01); *B05B 13/041* (2013.01);
(Continued)

(58) Field of Classification Search
CPC ............ B05D 1/025; B05D 3/141–148; C23C 18/1254; C23C 18/1287; C23C 18/1295; C23C 18/14

USPC ........ 427/489, 490, 491, 534–539, 578–579, 427/581, 424, 427, 427.3–427.7
See application file for complete search history.

(56) References Cited

U.S. PATENT DOCUMENTS 5,070,274 A * 12/1991 Yoshikawa ........... C23C 16/276
                                                    313/231.31
5,178,905 A     1/1993 Kanai et al.
(Continued)

OTHER PUBLICATIONS

PCT International Search Report and Written Opinion, PCT Application No. PCT/US18/25441, dated Jun. 20, 2018, 17 pages.
(Continued)

*Primary Examiner* — Marianne L Padgett
(74) *Attorney, Agent, or Firm* — Fenwick & West LLP (57) ABSTRACT

Embodiments relate to surface treating a substrate, spraying precursor onto the substrate using supercritical carrier fluid, and post-treating the substrate sprayed with the precursor to form a layer with nanometer thickness of material on the substrate. A spraying assembly for spraying the precursor includes one or more spraying modules and one or more radical injectors at one or more sides of the spraying module. A differential spread mechanism is provided between the spraying module and the radical injectors to inject spread gas that isolates the sprayed precursor and radicals generated by the radical injectors. As relative movement between the substrate and the spraying assembly is made, portions of the substrate is exposed to first radicals, sprayed with precursors either one of the spraying modules or both spraying modules using supercritical carrier fluid, and then exposed to second radicals again.

12 Claims, 11 Drawing Sheets

(51) Int. Cl.
    *B05B 7/16*     (2006.01)
    *B05D 3/14*     (2006.01)
    *H05H 1/42*     (2006.01)
    *H05H 1/00*     (2006.01)
    *C23C 18/14*     (2006.01)
    *C23C 18/12*     (2006.01)
    *B05B 13/04*     (2006.01)

(52) U.S. Cl.
    CPC ...... *B05B 13/0405* (2013.01); *B05D 2401/00* (2013.01); *B05D 2401/90* (2013.01)

(56) References Cited

U.S. PATENT DOCUMENTS

| | | | | |
|---|---|---|---|---|
| 5,270,082 | A * | 12/1993 | Lin | C08G 61/025 427/255.6 |
| 5,374,305 | A | 12/1994 | Glancy et al. | |
| 5,453,494 | A * | 9/1995 | Kirlin | C23C 16/18 427/248.1 |
| 5,840,897 | A * | 11/1998 | Kirlin | C07F 3/003 546/2 |
| 6,085,762 | A | 7/2000 | Barton | |
| 6,110,529 | A * | 8/2000 | Gardiner | C23C 16/4483 427/250 |
| 6,329,899 | B1 * | 12/2001 | Hunt | C23C 16/40 257/E21.004 |
| 9,352,355 | B1 | 5/2016 | Jackson et al. | |
| 9,508,547 | B1 * | 11/2016 | Pasquale | C23C 16/401 |
| 9,960,017 | B2 * | 5/2018 | Ikedo | H05H 1/24 |
| 10,661,287 | B2 | 5/2020 | Jackson | |
| 2001/0026850 | A1 * | 10/2001 | Shah | H01G 9/04 427/600 |
| 2003/0049384 | A1 * | 3/2003 | Liu | C03C 17/001 427/427 |
| 2004/0003828 | A1 * | 1/2004 | Jackson | B08B 7/0021 134/1 |
| 2004/0023453 | A1 | 2/2004 | Xu et al. | |
| 2005/0123777 | A1 * | 6/2005 | Maijala | B05B 5/087 428/457 |
| 2005/0147749 | A1 | 7/2005 | Liu et al. | |
| 2006/0275542 | A1 * | 12/2006 | Mehta | B05D 1/025 427/180 |
| 2007/0265357 | A1 * | 11/2007 | Iversen | B01D 9/005 516/1 |
| 2010/0028561 | A1 | 2/2010 | Dubreuil et al. | |
| 2010/0037824 | A1 * | 2/2010 | Lee | C23C 16/513 118/723 R |
| 2010/0143608 | A1 * | 6/2010 | Ruiz | C23C 16/06 427/576 |
| 2011/0097516 | A1 | 4/2011 | Makino et al. | |
| 2011/0262650 | A1 * | 10/2011 | Lee | C23C 16/4486 427/457 |
| 2013/0012029 | A1 * | 1/2013 | Vermeer | C23C 16/0245 438/758 |
| 2013/0078392 | A1 * | 3/2013 | Xiao | C07F 7/025 427/579 |
| 2015/0259793 | A1 | 9/2015 | Lee et al. | |
| 2016/0329193 | A1 * | 11/2016 | Sieber | H01J 37/32449 |
| 2018/0280998 | A1 | 10/2018 | Jackson | |
| 2019/0062914 | A1 | 2/2019 | King et al. | |
| 2019/0292661 | A1 * | 9/2019 | Lee | C23C 16/455 |
| 2020/0030844 | A1 * | 1/2020 | Lee | B05D 1/025 |
| 2020/0071830 | A1 * | 3/2020 | Lee | H01L 21/02101 |
| 2020/0170107 | A1 | 5/2020 | Lee | |

OTHER PUBLICATIONS

United States Office Action, U.S. Appl. No. 16/590,741, dated Dec. 28, 2020, 42 pages.

* cited by examiner

DEPOSITING OF MATERIAL BY SPRAYING PRECURSOR USING SUPERCRITICAL FLUID

CROSS-REFERENCE TO RELATED APPLICATION

This application claims the benefit of U.S. Provisional Application No. 62/482,128, filed on Apr. 5, 2017, which is hereby incorporated by reference in its entirety.

BACKGROUND

1. Field of Art

The disclosure relates to depositing a material on a substrate by a mixture of spraying supercritical fluid containing precursor by a spraying module surrounded by a plasma reactor.

2. Description of the Related Art

Various methods may be used to deposit a firm on a substrate. Such methods include, for example, chemical vapor deposition (CVD), atomic layer deposition (ALD), molecular layer deposition (MLD). Deposition methods such as CVD, ALD and MLD are typically performed in vacuum environment that involve the use of a large equipment to enclose the processing assembly therein as well as removal of air from the processing assembly. Moreover, due to the dehydration, decomposition, physical shrinkage, substrates and/or precursor used in such deposition methods may be restricted.

Air spraying of precursor is another method that can be used to deposit film on a substrate. When using the spray, the liquid precursor forms droplets on the substrate due to the surface tension. Although the droplet size can be adjusted by varying either the nozzle gas (air or nitrogen) or liquid pressure, conventional atomizing nozzles produce droplet sizes in the range of 100 microns to 20 microns at atmospheric pressure. Typically, more than a single round of spray is performed on the substrate. However, the surface tension and the uneven exposure to the droplets result in an uneven surface and are generally inadequate to produce continuous films, especially, of nanometer thickness on the substrate.

Ultrasonic atomizing nozzle with low-pressure carrier gas may be used to produce spray droplets of small sizes. Droplet size in an ultrasonically produced spray is governed by the frequency at which the nozzle vibrates, and by the surface tension and density of the liquid being atomized. In ultrasonic spay systems, frequency is the predominant factor and higher frequency tends to generate droplets of a smaller median size. Typically, the drop size from ultrasonic nozzles is larger than 10 microns and the droplets forms non-continuous and non-fully covered coating on the substrate.

A spray process may require a substrate to be placed at a high temperature for processes such as baking or pyrolysis to convert sprayed coatings into a solid film followed by either ex-situ post-plasma treatment or rapid temperature annealing (RTA) process to obtain good mechanical and electrical properties of the final films. Due to the motion of fluids (e.g., ambient gas) on a hot surface of the substrate, hot fluid surrounding a hot substrate rises and forms convecting boundary layer over the substrate. Mainly for this reason, light droplets or small droplets riding above a hot substrate and does not reach the hot substrate. As heavy droplets or large droplets can overcome the convecting boundary layer, absorbed precursor from these droplets onto the substrate can be engaged for solid coatings of several micrometer thickness on the hot substrate. Hence, the spray or ink-jet techniques with a precursor having high pyrolysis temperature or a precursor of a solid film formation at a high temperature (i.e., thermal reaction during spray or ink-jet processes) are not suitable for forming continuous thin films of a thickness smaller than several hundred nanometers.

SUMMARY

Embodiments relate to depositing material on a substrate using an apparatus. The apparatus includes a spraying module and a plasma reactor. The spraying module sprays a mixture of precursor and a supercritical carrier fluid onto the substrate to expose the precursor for absorbing molecules as a source of the spraying film. The plasma reactor is adjacent to the spraying module.

In one embodiment, the plasma reactor exposes the substrate at a temperature below 150° C. to counteract the effects of a convecting boundary layer injected with the mixture to post-spraying radicals.

In one embodiment, a passage between the spraying module and the plasma reactor conveys spread gas. A portion of the spread gas may be used at the plasma reactor for generating the pre-spraying radicals to activate the surface of the substrate, for generating post-spraying radicals to transform the sprayed layer into a solid layer, for confining the precursor exposure to areas below the spray chamber, and for controlling a removal rate of non-chemisorbed molecules from the surface of the substrate.

In one or more embodiments, the apparatus includes a second plasma reactor adjacent to the spraying module at a side opposite to the first plasma reactor. The second plasma reactor exposes the substrate to pre-spraying radicals before spraying the mixture onto the substrate to pre-treat the substrate.

In one or more embodiments, the substrate is placed in atmospheric pressure in the spraying module and the first plasma reactor.

In one or more embodiments, the supercritical carrier fluid is one of carbon dioxide ($CO_2$), Ethane ($C_2H_6$), Propane ($C_3H_8$), Ethylene ($C_2H_4$), Propylene ($C_3H_6$), Ethanol ($C_2H_5OH$), and Acetone ($C_3H_6O$).

In one or more embodiments, the apparatus includes an actuator that moves the spraying module or the plasma reactor relative to the substrate to change a height of the spraying module or a height of the plasma module. The portion of the spread gas used for generating the pre-spraying and post-spraying radicals and/or changing the removal rate non-chemisorbed molecules is changed by the moving of the spraying module or the plasma reactor.

In one or more embodiments, the spread gas is $N_2$, Ar, $N_2O$, $H_2$, $O_2$, $CO_2$, $O_3$, $NH_3$ or a combination thereof.

In one or more embodiments, the apparatus includes a mechanism causing a relative movement between the spraying module and the plasma reactor to spray the mixture to different portions of the substrate, and to expose different portions of the substrate to the post-spraying radicals.

In one or more embodiments, the spraying module is formed with an exhaust configured to discharge at least a portion of remaining mixture after injecting the mixture to the substrate.

In one or more embodiments, the substrate is an organic material or an inorganic material.

In one or more embodiments, the precursor is one of Ethylene glycol, 4-Aminothiophenol or silver sulfate.

DETAILED DESCRIPTION OF EMBODIMENTS

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Embodiments relate to surface treating a substrate, spraying precursor onto the substrate using supercritical carrier fluid, and post-treating the substrate sprayed with the precursor to form a layer of material on the substrate. A spraying assembly for spraying the precursor includes a spraying module and one or more plasma reactors at one or more sides of the spraying module. A differential spread mechanism is provided between the spraying module and the radical injectors to inject spread gas that isolates the sprayed precursor and radicals generated by the radical injectors. A part of the spread gas is used to generate the radicals.

Figure 1:
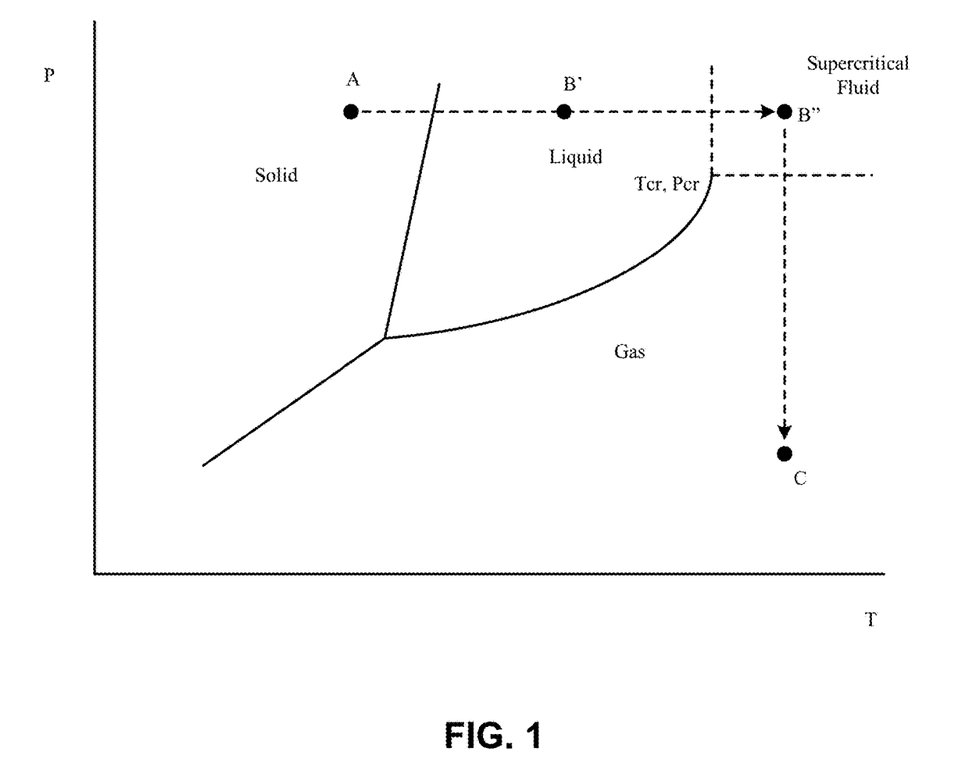
FIG. 1 is a phase diagram of a carrier gas for spraying a precursor, according to one embodiment.

Supercritical fluid is used as a carry gas for carrying precursor that coats a film on a substrate. The supercritical carrier fluid does not exhibit surface tension, as there is no liquid/gas phase boundary. Therefore, the carrier fluid and the precursor form an even surface on the substrate when the supercritical fluid is used to spray the precursor onto the substrate, as its phase has changed from B" to C in FIG. 1. FIG. 1 is a phase diagram illustrating phases of a material. As shown in FIG. 1, when the pressure and temperature exceeds a threshold, the material is placed in a supercritical fluidic state. In the example of carbon dioxide, the threshold temperature $T_{Cr}$ and the threshold pressure $P_{Cr}$ are 73.8 bar and 31.1° C., respectively, and $T_{Cr}$ and $P_{Cr}$ are 45.4 bar and 91.9° C. for Propylene ($C_3H_6$).

Various materials can be used as the supercritical carrier fluid. One example material is carbon dioxide. $CO_2$ is relatively inexpensive, nonflammable, non-reactive (i.e., chemically inert) at the surface of the substrate in an atmospheric pressure which is lower than the critical pressure $P_{Cr}$ of $CO_2$ (i.e., 73.8 bar). This means that $CO_2$ will not be involved in the reaction for the film formation at the substrate temperature lower than the boiling point of the precursor. The use of $CO_2$ also does not create a problem with respect to the greenhouse effect as $CO_2$ is conserved during the spraying process. For industrial applications, low $P_{Cr}$ solvents having liquid or solid phase in ambient condition, such as propane, ethylene, propylene, ethanol and aceton, may be used instead of $CO_2$.

A precursor is material that is mixed with the supercritical carrier fluid for injection onto the surface of the substrate. The precursor reacts on the surface of the substrate to deposit a material on the substrate. The precursor may have a higher boiling point than the temperature of the substrate or the temperature at which the spraying or injection is performed. The precursor may exist as liquid or solid in the ambient atmospheric pressure. The precursor may include organic material such as diol which is a chemical compound containing two hydroxyl groups (—OH groups) as homobifunctional ligand, thiol which is a sulfur-containing analog of an alcohol as heterobifunctional ligand, and inorganic material such as silver sulfate.

FIG. 2 is a perspective view of spraying assembly 230 cut across a vertical plane 242, according to one embodiment. The spraying assembly 230 in the embodiment of FIG. 2 is elongated with its bottom facing substrate 200. The spraying assembly 230 may include, among other components, spraying module 260, a differential spread mechanism (described below in detail with reference to FIG. 3B), and plasma reactors 270A, 270B. The plasma reactors 270A, 270B may be a single plasma reactor that surrounds the spraying module 260 or may be separate devices placed at opposite sides of the spraying assembly 230. The plasma reactors 270A, 270B may be an atmospheric pressure (AP) plasma reactor that produces radicals in atmospheric pressure. The plasma reactors 270A, 270B may be a sub-atmospheric or low pressure plasma reactor that produces radicals at a pressure higher than 100 Torr.

Although the spraying module 260 and the plasma reactors 270A, 270B are illustrated in FIG. 2 as a linear source that provides mixture or plasma along the entire length of the spraying assembly 230, one or more of these may be embodied as one or more point source devices.

FIG. 3A is a cross sectional view of the spraying assembly 230 taken along the vertical plane 242, according to one embodiment. The spraying module 260 includes a body 320 formed with a spray chamber 352 into which a spray nozzle 318 injects a mixture of supercritical carrier fluid and a precursor. Pressurized gas 374 (e.g., nitrogen gas) is injected through conduit 369 towards the substrate 200 to eject the mixture onto the substrate 200. After the mixture comes into contact with the substrate 200, the precursor is deposited on the substrate while the carrier fluid and/or remaining precursor is discharged through exhausts 354A, 354B formed in the body 320. By discharging the carrier fluid and/or remaining precursor through the exhausts 354A, 354B, the range or spread upon which the precursor deposited on the substrate 200 can be confined and controlled to areas below the spray chamber 352.

The spread and/or pressure of the mixture ejected from the nozzle 318 may be modified or controlled by, among others, (i) positioning of the spray nozzle 318, (ii) the size and shape of the spray chamber 352, (iii) the flow rate of the supercritical carrier fluid, and (iv) the flow rate of the pressurized gas 374. If an electrohydrodynamic (EHD) atomizer is used as the nozzle 318, the electric field or voltage applied to the EHD atomizer may also determine the spread and/or pressure of the mixture ejected from the nozzle 318.

The nozzle 318 receives the mixture from a regulator 390. The regulator 390 regulates the pressure and/or temperature of the carrier fluid or the mixture of carrier fluid and the precursor provided to the nozzle 318 so that the carrier fluid (e.g., $CO_2$, or propane) maintains a liquid-like supercritical fluid state or behaviors as a liquid at the tip of nozzle 318, and the mixture of carrier fluid and the precursor travels as gas-like supercritical fluid state or as gases from the nozzle 318 to the opening of the body 320 and reaches at the surface of the substrate 200. In doing so, the phase of the fluid or gas from the nozzle 318 transitions from supercritical state (e.g., state B" in FIG. 1) to gas (e.g., state C in FIG. 1). By using ethylene as a supercritical fluid and viscous resin such as Methyl methacrylate (MMA:$CH_2$=$C(CH_3)COO$—$CH_3$) or acrylates and O* radical from the plasma reactor, a stable polymer film or crosslinking monomers with [$CH_2$—C($CH_3$)—COO—$CH_3$]$_n$ structure or similar structures, and Acrylonitrile ($CH_2$=$CH$—$CN$) with N* radical from the plasma reactor may form a stable polymer film with [$CH_2$—CH—CN]n structure or similar structures may be formed on the substrate.

Figure 2:
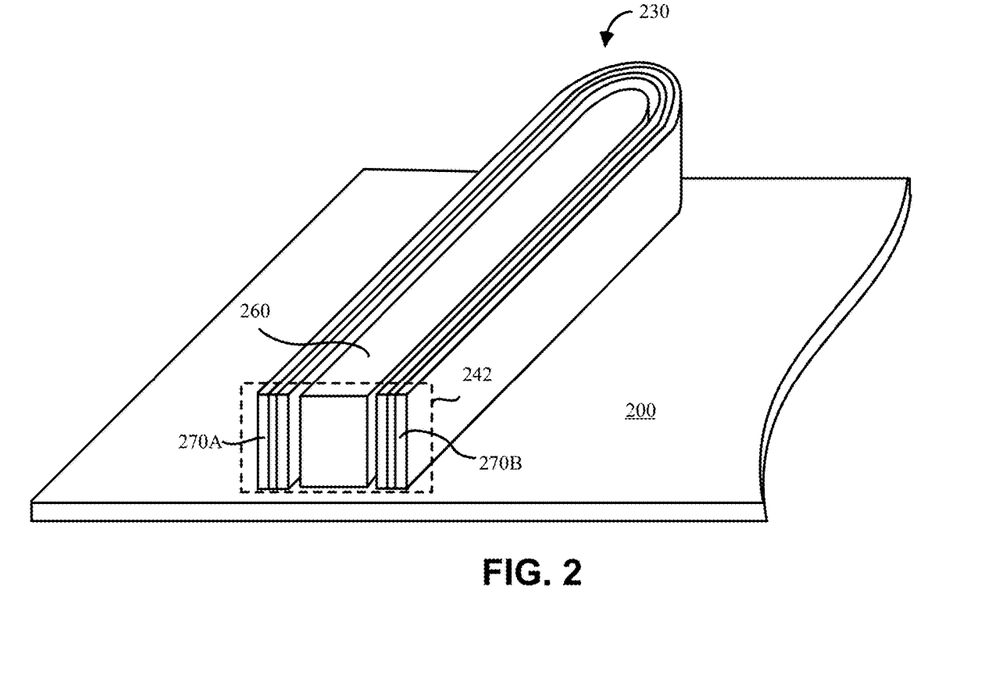
FIG. 2 is a perspective view of a spraying assembly, according to one embodiment.

The plasma reactors 270A, 270B are placed at each side of the spraying module 260. The plasma reactors 270A, 270B may include electrodes 372 and 378 that are connected to form a common outer electrode, electrodes 373 and 376 that are connected to form an inner electrode. The outer electrode and the inner electrode may form a single plasma reactor, as illustrated in FIG. 2. Alternatively, the plasma reactors 270A, 270B may be configured separately and be controlled independent of each other. In the embodiment shown in FIG. 3A, the substrate 200 moves from the left to the right, passing below the plasma reactor 270A, the spraying module 260, and the plasma reactor 270B, in sequence. The plasma reactor 270A generates and injects radicals to perform pre-spraying surface treatment (e.g., activation of the surface) on a portion of the substrate before spaying the mixture of supercritical carrier fluid and the precursor onto the portion of the substrate by the spraying module 260. The plasma reactor 270B generates and injects post-spraying radicals to treat (e.g., annealing) the portion of the substrate sprayed with the mixture by the spraying module 260.

Figure 3A:
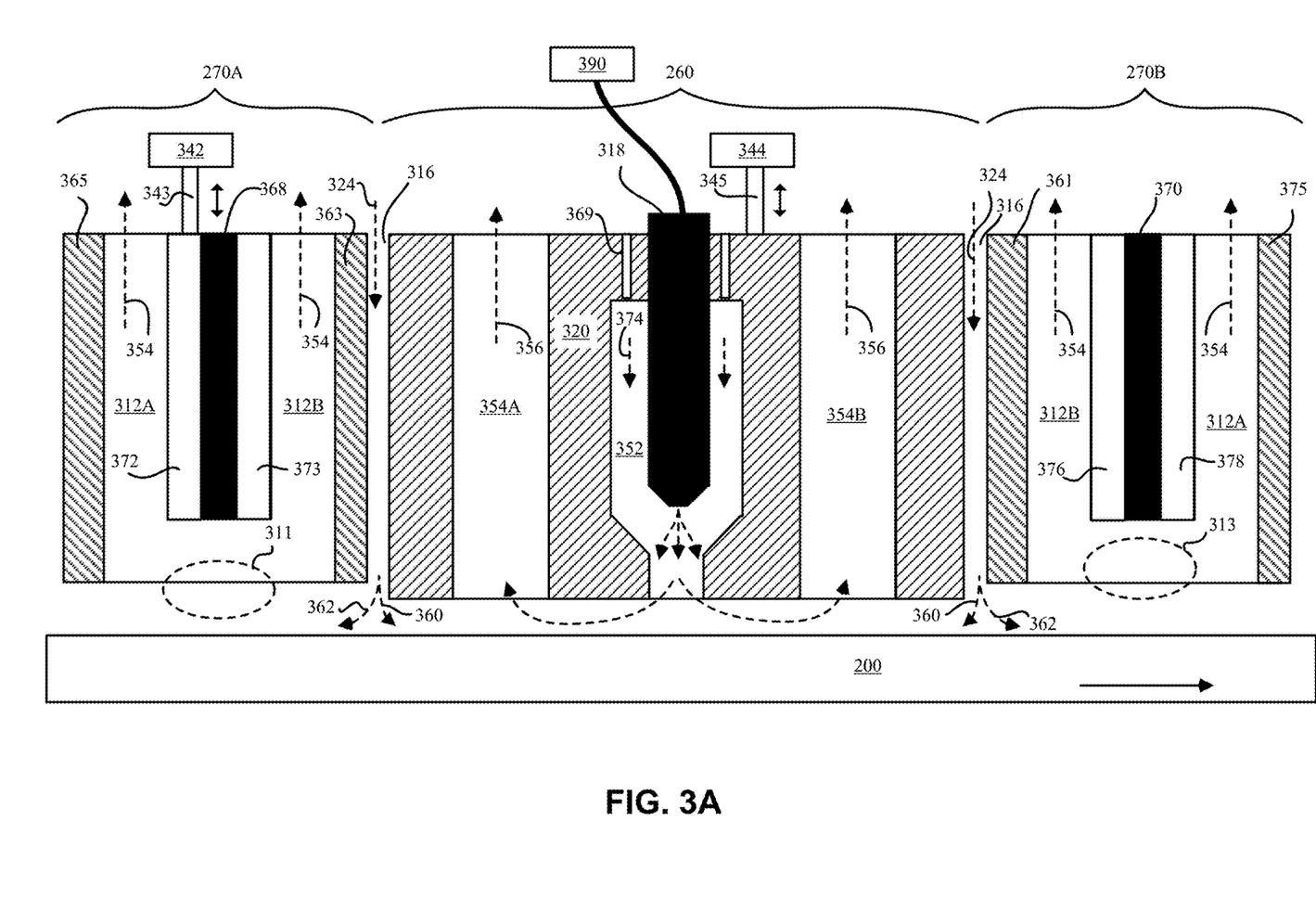
FIG. 3A is a cross sectional view of the spraying assembly, according to one embodiment.

The plasma reactor 270A includes outer walls 363, 365 that enclose gas for generating radicals. Electrodes 372, 373 extend down into the plasma reactor 270A between the walls 363, 365 with insulation bodies on the electrodes 372, 373 to form a dielectric breakdown discharge (DBD) plasma reactor. By applying voltage difference between the two electrodes 372, 373, radicals are filled in region 311 below the electrodes 372, 373. Gas 362 for generating the radicals is provided via a gap 316 (i.e., passage) between the plasma reactor 270A and the spraying module 260. That is, part of spread gas 324 injected into the gap 316 enters the bottom portion of the plasma reactor 270A as the gas 362 while the remaining gas 360 enters the bottom portion of the spraying module 260. The gas 362 is converted to radicals below electrodes 372, 373 and injected onto the portion of the substrate 200 below the plasma reactor 270A. The remaining portions of the gas 362 or generated radicals are discharged as discharge gas 354 via exhausts 312A, 312B formed in the plasma reactor 270A.

Another approach for generating more radicals is a primary DBD plasma generation between two electrodes 372, 373 and a secondary plasma generation by using a portion 362 of the spread gas injected through the gap 316. The plasma reactor 270A includes outer walls 363, 365 that enclose gas for generating radicals. Electrodes 372, 373 extend down into the plasma reactor 270A between the walls 363, 365 with insulation bodies on the electrodes 372, 373 to form a dielectric breakdown discharge (DBD) plasma reactor. By applying voltage difference between the two electrodes 372, 373 and using the plasma gas such as $O_2$ or $H_2O$ or $N_2O$ or $O_3$ as O* radicals, $H_2$ or $NH_3$ for H* radicals, $NH_3$ as N* radicals, DBD plasma 368 generate downstream of radicals and active species such as electrons and/or ions that fill the space/region 311. Gas 362 for generating secondary plasma for radicals and active species at the space/region 311 is provided via a gap 316 between the plasma reactor 270A and the spraying module 260. The gas 362 is converted to radicals with active species generated from the secondary plasma below electrodes 372, 373 and fill the space/region 311. As a result of combining the radicals generated from primary plasma and the secondary plasma, more radicals and/or active species can be injected onto the portion of the substrate 200 below the plasma reactor 270A.

The plasma reactor 270B has the same structure as the plasma reactor 270A. The plasma reactor 270B has walls 361, 375 that enclose the gas for generating the radicals within the plasma reactor 270B. Electrodes 376, 378 extend down into the plasma reactor 270B between the walls 361, 375. Insulation bodies are placed on the electrodes 376, 378, for example, of thickness 0.5 mm to 5 mm. The insulation body may be dielectric material such as $Al_2O_3$ or $SiO_2$. As in the plasma reactor 270A, gas 362 for generating the secondary plasma is provided via a gap 316 between the plasma reactor 270B and the spraying module 260. The gas 362 is converted to the radicals with active species below electrodes 376, 378 and in region 313, and injected onto the portion of the substrate 200 below the plasma reactor 270B. The remaining portions of the gas 362 or generated radicals are discharged as discharge gas 354 via exhausts 312A, 312B formed in the plasma reactor 270B.

Providing exhausts 312A, 312B in the plasma reactor 270A, 270B separately from exhausts 354A, 354B in the spraying module 260 is advantageous, among other reasons, because undesirable reaction between precursor ejected from the spray nozzle 318 and the plasma species from the plasma reactors 270A, 270B may be reduced or avoided. For non-oxide films of inorganic and/or organic material, ethane, propane, ethylene, or propylene may be used as a supercritical fluid because these gases do not involve any oxygen atoms. For inorganic and/or organic oxide films, $CO_2$ or ethanol or acetone may be used as a supercritical fluid, but ethane, propane, ethylene, or propylene may also be used.

A differential spread mechanism is provided in the form of gaps (i.e., passages) between the spraying module 260 and the plasma reactors 270A, 270B, a height difference between the spraying module 260 and the plasma reactors 270A, 270B, and actuators 342, 344 that raise or lower the spraying module 260 or the plasma reactors 270A, 270B. The differential spread mechanism functions to divide spread gas 324 to a portion of gas 362 that flows into the plasma reactors 270A, 270B and a portion of gas 360 that enters the spraying module 260 to confine the spraying module 260 and segregate the spray from the plasma reactors 270A, 270B. The spread gas may be gas such as $N_2$, Ar, $N_2O$, $H_2$, $O_2$, $CO_2$, $O_3$, $NH_3$ or any combination thereof. Because the spread gas is used as gas for generating radicals at the space/region 311, 313, the spread gas may be selected so that appropriate radical species are generated by the plasma reactors 270A, 270B. Another function of the spread gas is to confine the precursor deposited on the substrate 200 from the plasma reactor 270A, 270B by providing the portion 360 of the spread gas apart from the portion 362 of the spread gas. In general, fluid density and wettability of the sprayed stream that contains the source precursor and the carrier fluid are higher than those of the plasma gas, and the diffusion velocities of the plasma gas and/or radicals is higher than that of the sprayed stream. Therefore, the amount of the spread gas 362 may be increased relative to the spread gas 360 to block the diffusion of the plasma species into the spray assembly and avoid the mixing of the source precursor with radicals at the bottoms of the gap 316. The portions of the spread gases, 360, 362 can be modified by changing the heights H1, H2 and the widths W1, W2.

Figure 3B:
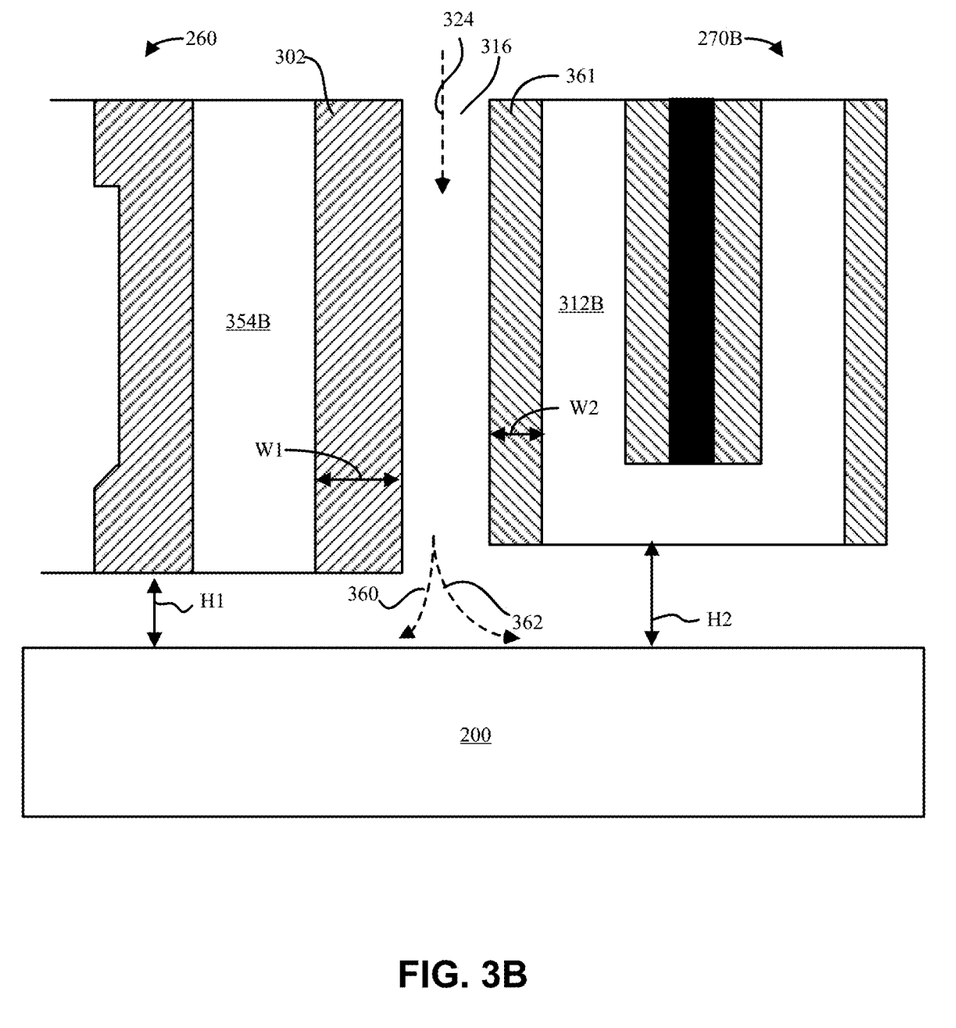
FIG. 3B is a zoomed-in version of a portion of the spraying assembly, according to one embodiment.

FIG. 3B is a zoomed-in version of a portion of the spraying assembly 230 illustrated in FIG. 3A. As shown, the spread gas 324 enters the gap 316 between the spraying module 260 and the plasma reactor 270B, flows between the walls 302, 361 until the spread gas 324 reaches the bottom of the gap 316 where the spread gas 324 is divided into portion 360 and 362, as described above with reference to FIG. 3A. The spread ratio between the portions 360, 362 may be determined by, among others, width W1 of wall 302 and width W2 of wall 361, as well as ratio between the height H1 from the substrate 200 to the spraying module 260 and the height H2 from the substrate 200 to the plasma reactor 270B.

In one embodiment, the spread ratio may be controlled by raising or lowering the spraying module 260 and the plasma reactors 270A, 270B using actuators 342, 344 connected to the spraying module 260 and the plasma reactors 270A, 270B via connectors 343, 345. As the height H1 is increased relative to the height H2, the portion 360 is increased relative to the portion 362. Conversely, as the height H1 is decreased relative to the height H2, the portion 360 is decreased relative to the portion 362. By increasing the width W2, the portion 360 of the spread gas is increased relative to the portion 362 of the spread gas because of pressure buildup at the bottom of the wall 361 due to increased flow restriction or decreased fluid conductance. Conversely, as the width of W2 is decreased, the portion 360 of the spread gas is decreased because of reduced fluid resistance at the bottom of the wall 361.

Although the embodiment of FIGS. 3A and 3B has two actuators 342, 344 to control the heights of the spraying module 260 and the plasma reactors 270A, 270B, only a single actuator may be used to adjust only the height of the spraying module 260 or the height of the plasma reactors 270A, 270B. In other embodiments, another actuator may be provided to adjust the heights of the plasma reactor 270A and plasma reactor 270B individually.

Figure 4A:
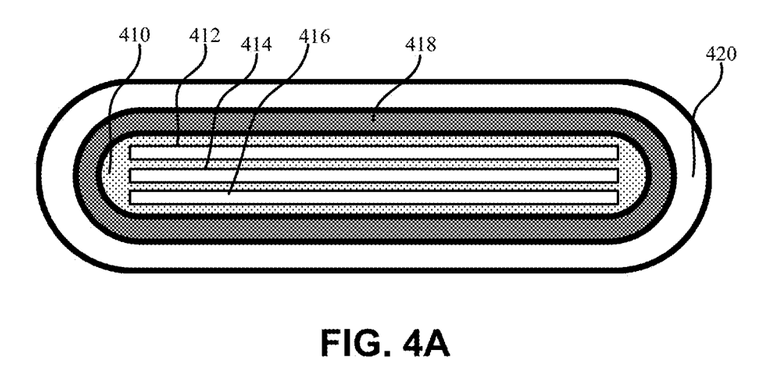
FIGS. 4A through 4D are bottom views of spraying assemblies of different configurations, according to embodiments.

FIGS. 4A through 4D are bottom views of spraying assemblies of different configurations, according to embodiments. FIG. 4A is a bottom view of a spraying assembly with an elongated configuration and rounded ends, similar to what is shown in FIG. 2. The spraying assembly of FIG. 4A includes a spraying module 410 and a plasma reactor 420. The spraying module 410 and the plasma reactor 420 are separated by gap 418. The gap 418 may have differential spread mechanism as described above with reference to FIGS. 3A and 3B. The spraying module 410 includes a spray chamber 414 and exhausts 412, 416 at both sides of the spray chamber 414.

Figure 4B:
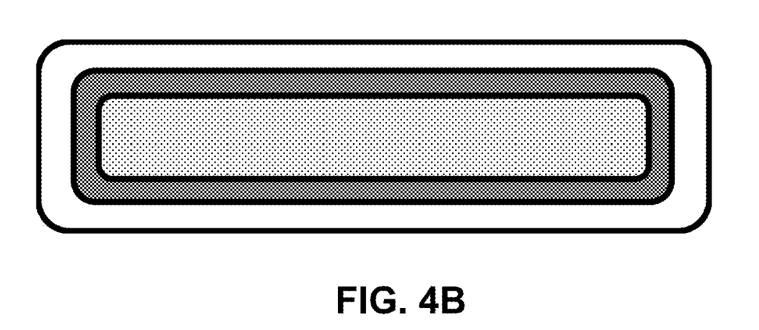
Figure 4C:
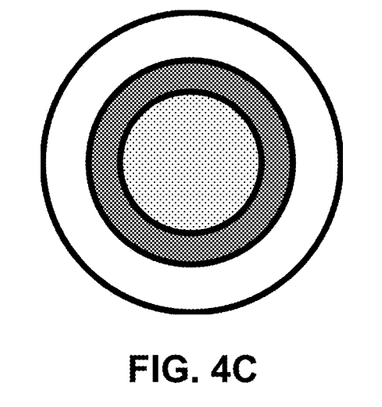
Figure 4D:
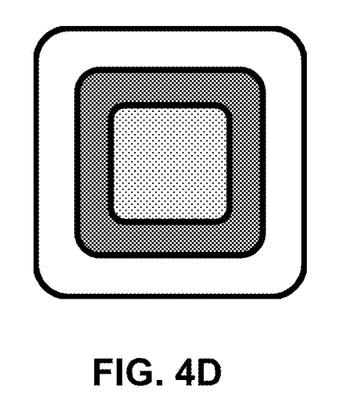

FIG. 4B is a bottom view of a spraying assembly, according to one embodiment. The embodiment of FIG. 4B is identical to the embodiment of FIG. 4A except that the ends have squared edges instead of round edges. Embodiments of FIGS. 4C and 4D are substantially identical to the embodiment of FIG. 4A, except that the spray assemblies have a circular or square shape. Further, the spray chamber and the exhausts are not illustrated in FIGS. 4B through 4D for the sake of convenience.

Figure 5:
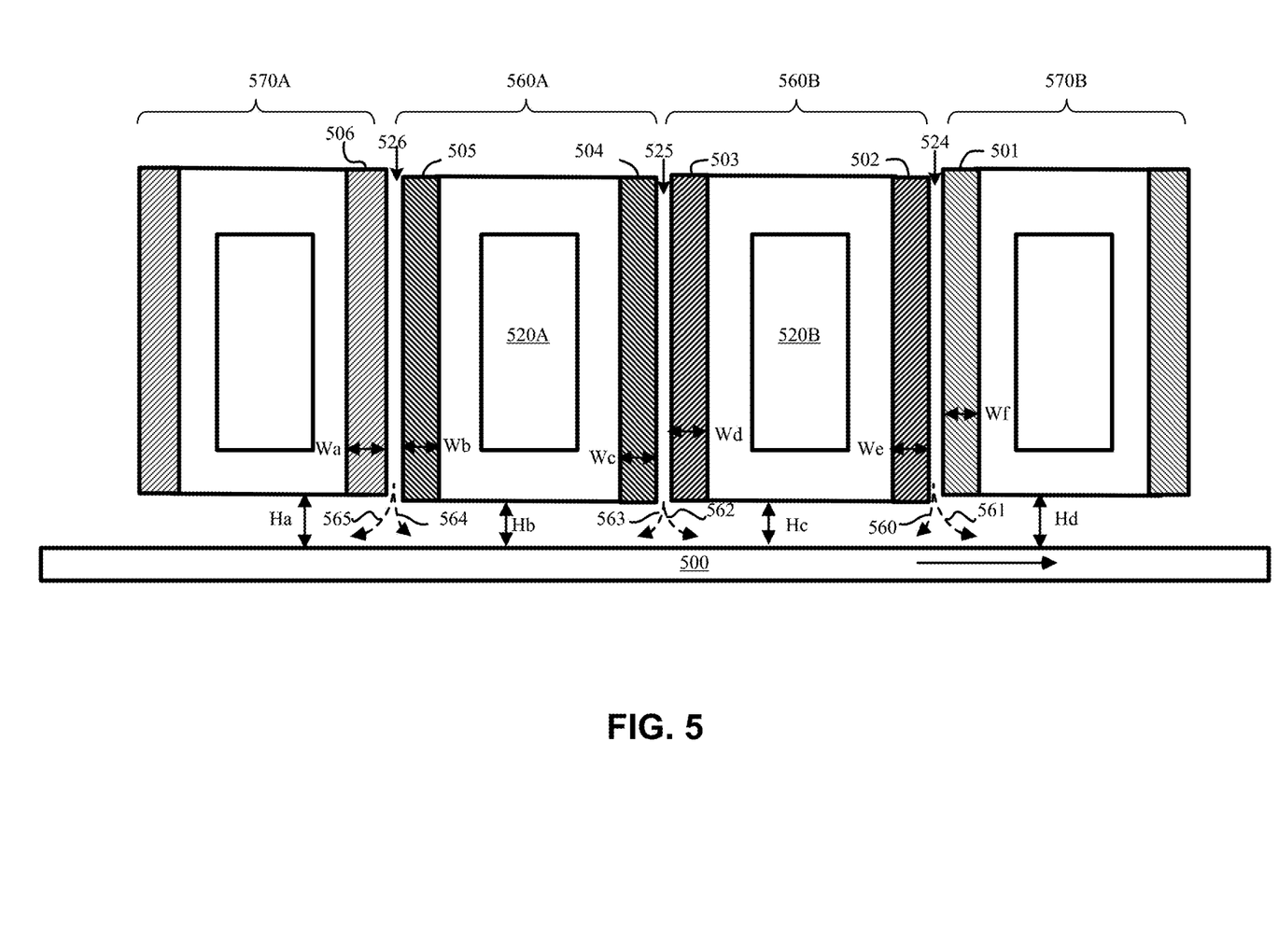
FIG. 5 is a cross section view of a spraying assembly with multiple spraying modules for spraying different precursor materials, according to one embodiment.

FIG. 5 is a cross sectional view of two spraying assemblies 560A, 560B placed in tandem for spraying different precursors to form a composite film, a mixed film or laminated film, according to one embodiment. As substrate 500 is moved from the left to the right, the substrate is sprayed with a first precursor by a spraying module 560A and then sprayed with a second precursor by a spraying module 560B. In this way, the first precursor can be transformed into a solid film by chemical reactions with the second precursor, resulting in a so-called pre-reaction layer. For an example, Alucone-like nanolayer can be obtained by spraying ethylene glycol (EG) or other diols or dithiols or organic precursors having heterobifunctional groups with the supercritical fluid at the spraying module 560B onto the surface absorbed with TMA (trimethylaluminum) molecules as the pre-reaction layer which were performed at the spraying module 560A. TMA can be injected without the supercritical fluid because of its high vapor pressure. Other metalcone-like nanolayers can be obtained by using DMZ (dimethylzinc) for Zincone-like nanolayer, TMG (Trimethylgalium) for Galicone-like nanolayer, TMI (Trimethylindium) for Indicone-like nanolayer, TDMAZ (tertdimethylaminozirconium) for Zircone-like nanolayer, TSA (trisilylamine) for Silicone-like nanolayer, TDMAT (tertdimethylaminotitanium) for Titanicone-like nanolayer, etc.

By discharging the carrier fluid and/or remaining precursors through the exhausts 554A, 554B, 555A, 555B, the range or spread upon which the precursors deposited on the substrate 500 can be confined and controlled to areas below the spray chambers. As described above with reference to FIGS. 3A and 3B, the ratios of spread gas injected through gaps 524, 526 may be determined by, among others, width Wf of wall 501 and width We of wall 502, width Wd of wall 503 and width We of wall 504, width Wb of wall 505 and width Wa of wall 506, as well as ratio between height Hb from the substrate 500 to the spraying module 560A and height Ha from the substrate 500 to the plasma reactor 570A, height Hc from the substrate 500 to the spraying module 560A and height Hd from the substrate 500 to the spraying module 560B, and height Hd from the substrate 500 to the spraying module 560B and the height Ha from the substrate 500 to the plasma reactor 570B. The spread gas 524, 525,

526 can be controlled separately for different flow rate of the spread gas into the gaps 524, 525, 526.

By selecting an organic precursor as the source precursor in the spraying module 560A and its curing agent as the reactant precursor in the spraying module 560B, organic polymer film having a nanometer thickness can be obtained by exposing the radicals and active species generated in the plasma reactor 570B. Epoxy resin and curing agent can be used for depositing epoxy films having nanometer thickness with $N_2O$ or $O_2$ plasma. Pyromellitic dianhydride is an organic compound with the formula $C_6H_2(C_2O_3)_2$ that is used in the preparation of polymer polymers such as Kapton. Solid precursor (e.g., solid dianhydride powder) can be dissolved into a supercritical fluid and the supercritical fluid by utilizing a solid-to-liquid exchanger, as described below in detail with reference to FIG. 6. Aromatic polyimide films can be deposited with dianhydride as a source precursor in the spraying module 560A and diamine or diisocyanate as a reactant in the spraying module 560B and $N_2O$ or $NH_3$ as a plasma gas in the plasma reactor 570A, 570B. The function and operations of the plasma reactor 570A, 570B are identical to those of the plasma reactors 270A and 270B, and hence, detailed description thereof is omitted herein.

Figure 6:
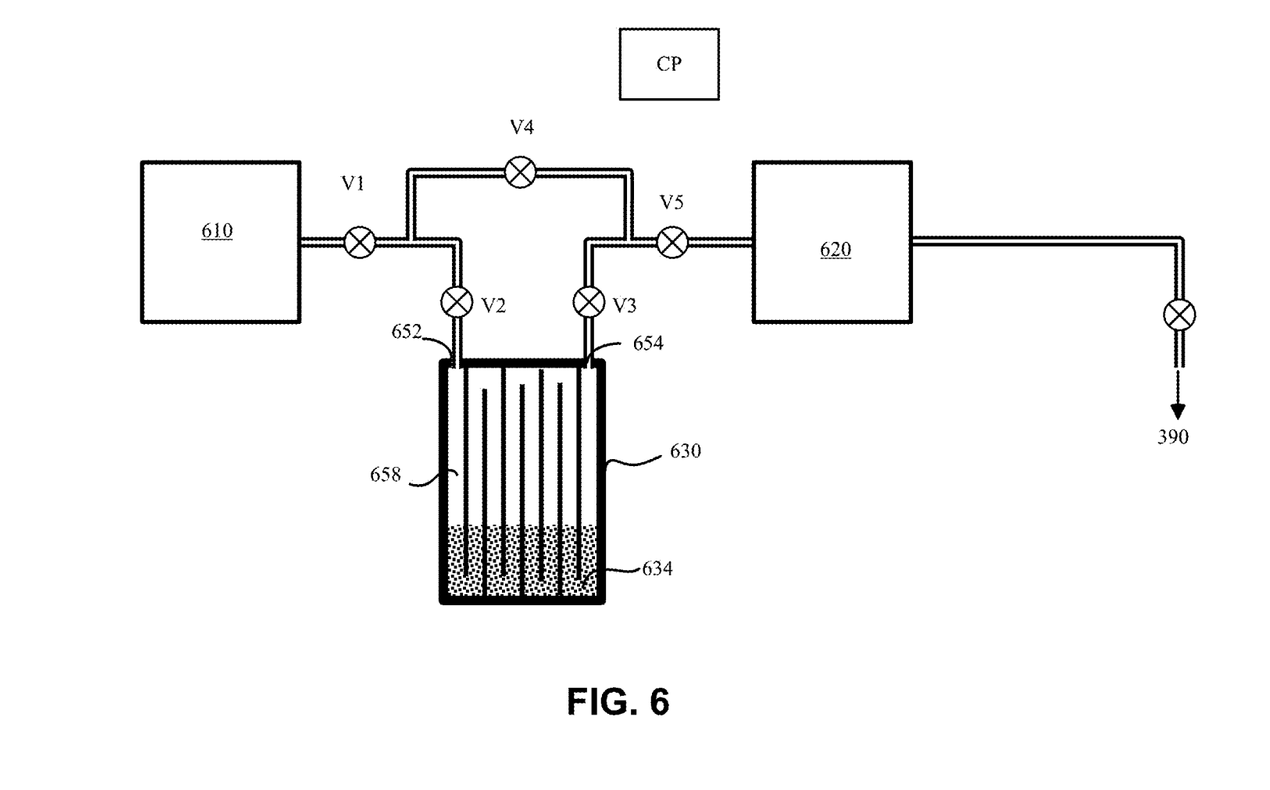
FIG. 6 is a block diagram of components for generating supercritical fluid with precursor, according to one embodiment.

FIG. 6 is a block diagram illustrating a system for dissolving solid precursor into a supercritical carrier fluid, according to one embodiment. A supercritical fluid container 610 provides supercritical carrier fluid to a solid-to-liquid exchanger 630 having an inlet 652 and an outlet 654. A path 658 is formed between the inlet 652 and the outlet 654, at least part of which includes solid precursor such as the dianhydride powder. As the supercritical carrier fluid is injected from the container 610 through valves V1 and V2 into the solid-to-liquid exchanger 630, the sold precursor is dissolved into the supercritical carrier fluid and discharged to container 620 via valves V3, V4. The container 620 holds the supercritical carrier fluid with the precursor for providing to the regulator 390. The operation of valves V1 through V5 may be controlled by a computer CP to provide adequate mix of precursor and the supercritical carrier fluid to the container 620.

Figure 7A:
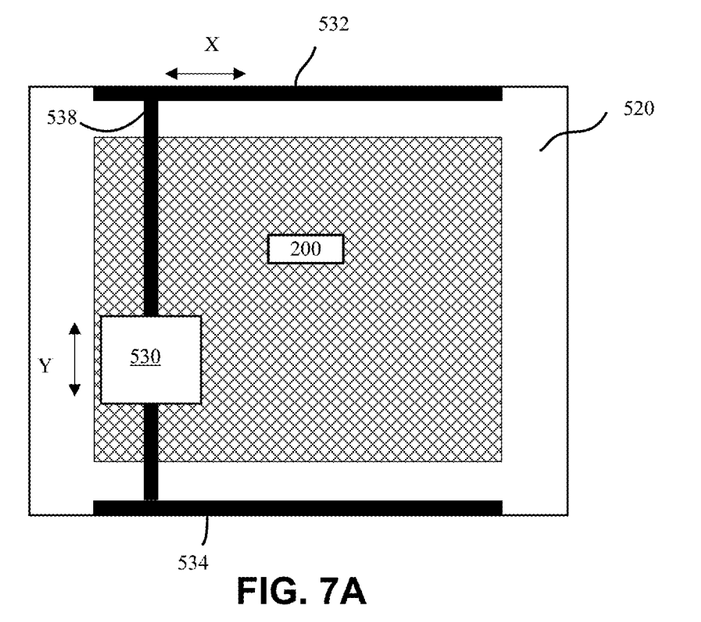
FIGS. 7A and 7B are plan views of moving spraying assemblies to spray precursor on a large substrate, according to embodiments.

FIG. 7A illustrates moving a point source spray assembly 530 in X and Y directions to process a substrate 200 that is larger than a spray/treatment area of the spray assembly 530. The substrate 200 is received on a susceptor 520. In the example of FIG. 5A, the spray assembly 530 is mounted on a rail 538 that enables the spray assembly 530 to move in Y direction. The rail 538 itself mounted on a pair of rails 532, 534 to move the rail 538 in X direction. One or more of the rails 532, 534, 538 may include a motor (e.g., linear motor) to cause the movement of the spray assembly 530. By moving the spray assembly 530 in X and Y directions, the substrate 200 with a large top surface can be processed by a single spray assembly 530.

Figure 7B:
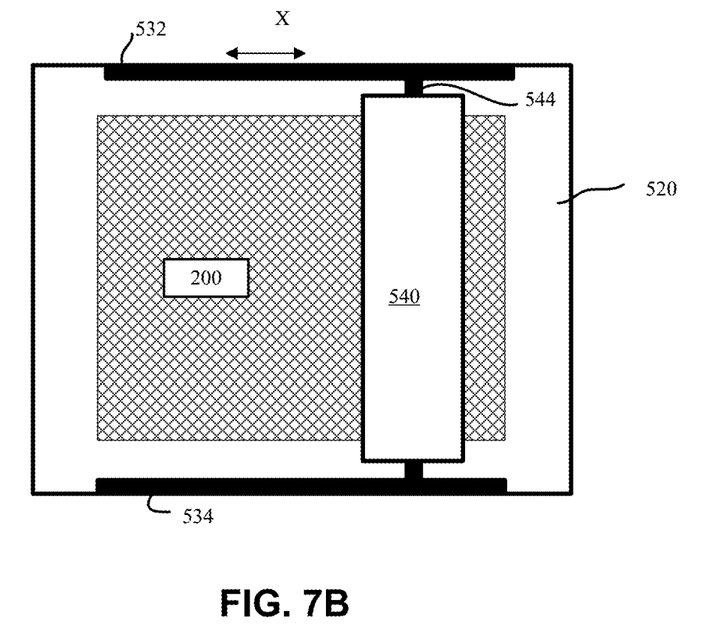

FIG. 7B illustrates moving a line source spray assembly 540 in X direction to process the substrate 200, according to one embodiment. The spray assembly 540 is mounted to a pair of rails 532, 534 via a supporting column 544. Unlike the embodiment of FIG. 5A, the spray assembly 540 moves only in X direction along the rails 532, 534.

In the embodiments of FIGS. 7A and 7B, the spray assemblies 530, 540 operate under atmospheric pressure, and hence, these spray assemblies 530, 540 are not enclosed in a separate vacuum chamber. In this way, the structure of the entire equipment is simplified while avoiding damages to substrates that may be caused by placing the substrates in a vacuum environment.

Although FIGS. 7A and 7B illustrate the spray assemblies 530, 540 moved in X or Y directions, the susceptor or the substrate may move in X or Y direction while the spray assembly remains stationary. Alternatively, the spray assembly may move in one direction (e.g., X direction) while the susceptor or the substrate moves in another direction (e.g., Y direction).

Figure 8:
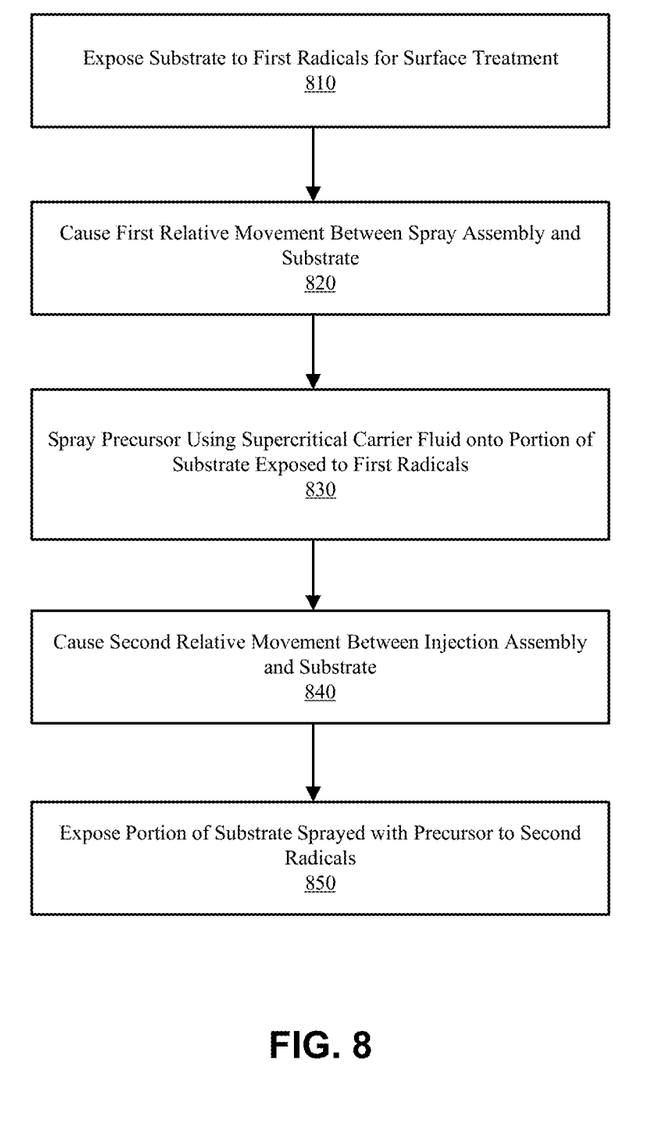
FIG. 8 is a flowchart illustrating depositing a material on a substrate using spraying, according to one embodiment.

FIG. 8 is a flowchart illustrating the process of depositing a layer on a substrate by spraying material onto the substrate, according to one embodiment. A substrate may be a raw substrate (e.g., silicon substrate) or a substrate already deposited with other materials such as $Al_2O_3$ or polymeric nano-layer (e.g., using other depositing methods such as chemical vapor deposition (CVD), atomic layer deposition (ALD) or spin coating).

The substrate is exposed 810 to first radicals (i.e., pre-spraying radicals) for treatment of the substrate by the first plasma reactor. By exposing the substrate to the first radicals (e.g., by the plasma reactor 270A), the surface of the substrate is activated for subsequent processes. Referring to the embodiments of FIGS. 11A and 11B, an organic substrate (e.g., collagen) with $CH_3$ attached surface may be treated with radicals to have an OH attached surface.

The substrate or the spray assembly is moved to cause 820 a first relative movement between the spray assembly and the substrate, as described above in detail with reference to FIGS. 7A and 7B.

Then a mixture of precursor and supercritical carrier fluid is sprayed 830 onto the substrate exposed to the first radicals (e.g., by the spraying module 260). The supercritical carrier fluid may be, for example, $CO_2$. The precursor may have a higher boiling temperature than the temperature of the substrate or the temperature at which the spraying is performed. The precursor may, for example, be ethylene glycol, 4-Aminothiophenol, 1,4-Cyclohexanediol and silver sulfate, as described below in detail with reference to FIGS. 9 through 12B.

The substrate or the spray assembly is again moved to cause 840 a second relative movement between the spray assembly and the substrate.

The portion of the substrate sprayed with the precursor is the exposed 850 to second radicals. The exposure to the second radicals may break the chains in the materials on the subsurface of the substrate or anneal the surface.

Various modifications may be made to the processes described above with reference to FIG. 8. For example, one or both of the processes of exposing the substrate to the radicals may be omitted. Moreover, the processes of exposing 810 to the first radicals to exposing 850 the substrate to second radicals may be repeated for a number of times to deposit a material of desired thickness on the substrate. When repeating the processes, the precursor sprayed onto the substrate in different cycles may be of the same material or different materials.

Figure 9:
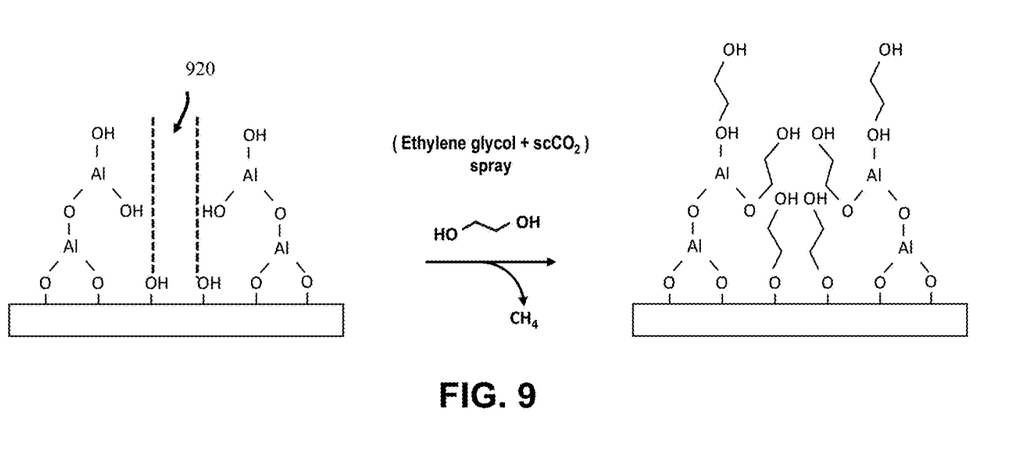
FIG. 9 is a diagram illustrating use of supercritical fluid to spray ethylene glycol to cover pinholes in an inorganic layer on a substrate, according to one embodiment.

FIG. 9 is a diagram illustrating the use of supercritical fluid as a carrier gas to spray ethylene glycol (EG), as one of homobifunctional precursors such as diols having two OH ligands (e.g., Butenediol, Butylenediol, Butanediol, Hexadiynediol, Hydroquinone), dithiols having two SH ligands (e.g. Ethanedithiol, Propanedithiol, Butanedithiol) to cover pinholes in an inorganic layer, according to one embodiment. A substrate shown in the left side of FIG. 9 is deposited with non-crystalline $Al_2O_3$ film, for example, by CVD to form a hermetic surface layer. The hermetic surface layer may have undesirable defects 920 (e.g., pinholes) formed therein.

In order to fill in the pinholes, the substrate is sprayed with a mixture of ethylene glycol and supercritical $CO_2$ fluid. As a result, the pinholes may be filled with organic prepolymers by an impregnation process. To form a water/moisture encapsulation layer, impregnation of an organic precursor to fill the micro-defects and to penetrate throughout the overall structure may be performed if pinholes or cracks or micro-porosities, or grain boundaries exist in the substrate. The number of the exposed molecules of the precursor sprayed/injected from the spray nozzle and the concentration of the precursor on the surface of the substrate are extremely larger than that of vacuum processes, for example, spraying relative to ALD/CVD or when vapor infiltration by spraying is 1 ATM relative to when the pressure is less than 0.5 Torr. Hence, the time for a diffusion of the precursor into the micro-defects for hermetic process can be shortened. Subsequently, the substrate may be exposed to O* radicals in atmospheric pressure to convert (OH) ligands to O ligands and cross-link O—O bonds.

Hence, the process of the embodiment may improve encapsulation/barrier properties by having precursor molecules coordinate with reactive sites in the micro-defects having broken bonds and high surface energy, and having infused precursors react within the micro-defects by exposing the substrate with the sprayed/injected precursor and successive exposure of the active plasma species. Other precursors, such as tetramethylbenzene, one of alkyl benzenes for the precursor to pyromellitic dianhydride which is used for coating, or dissolving organic precursor for the organic resins such as phenol into a supercritical fluid can be spayed in lieu of EG and successive exposure of $NH_3$ plasma. As shown in the example of FIG. 9, the precursor may be used to cure imperfections such as micro-cracks, micro-defects, pinholes, grain-boundaries or voids that may exist in a layer that is previously formed.

Figure 10A:
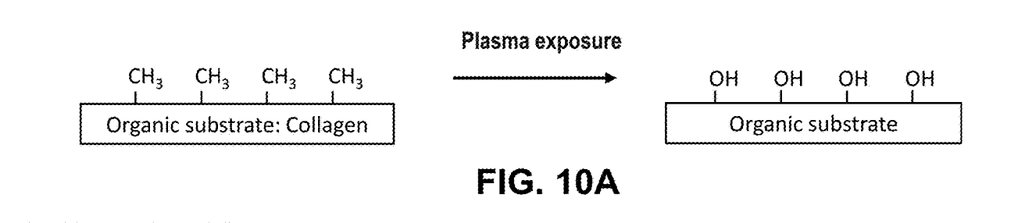
FIGS. 10A and 10B are diagrams illustrating forming an organic substrate from collagen and then spraying 4-Aminothiophenol onto the organic substrate to provide an OH-terminated surface, according to one embodiment.
Figure 10B:
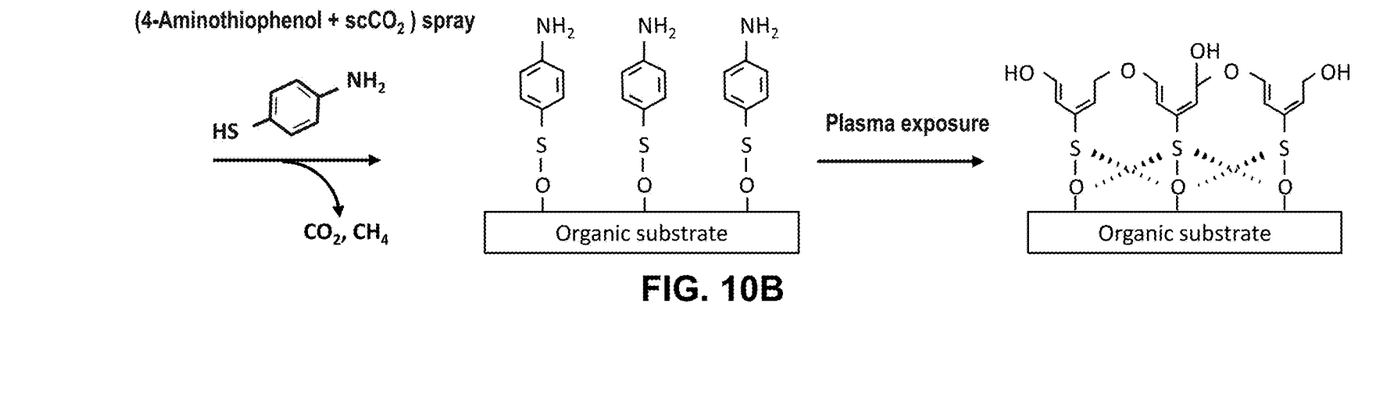

FIGS. 10A and 10B are diagrams illustrating forming an organic substrate from collagen and then spraying 4-Aminothiophenol as a heterobifunctional precursor having two different functional groups such as Cysteamine ($H_2N$—$C_2H_4$—HS), Butanethiol ($H_3C$—$C_3H_6$—HS), Chloropropanethiol (Cl—$C_3H_6$—HS) and Chlorothiophenol (SH—$C_6H_4$—Cl) onto the organic substrate to provide OH-terminated surface, according to one embodiment. In this example, the substrate is an organic material such as collagen terminated with $CH_3$. By exposing the substrate to OH* radicals, for example, the surface is terminated with OH, as shown in FIG. 10A.

The substrate is then sprayed with 4-Aminothiophnol using $CO_2$ supercritical fluid as a carrier gas. The spraying may be performed under atmospheric pressure. As a result, a covalent layer-by-layer assembly is formed on the substrate, as shown in FIG. 10B, and infiltration of the source precursor to infiltrate and react beneath the outer surface, forming an infused structure (not shown) at the interface having new chemical structure or covalent bonds within the organic substrate can be achieved, because the number of the supplied molecules of the precursor sprayed/injected from the spray nozzle is sufficient to infiltrate into the substrate. Subsequently, the substrate is exposed to $O_2$ plasma or $N_2O$ plasma for some sort of cross-linking process (shown dotted lines as cross-linkings in FIG. 10B) and ring-opening reactions of aromatic precursor enhanced by O* radicals and active species (e.g. electrons, ions) of the plasma performs a new composite overcoat with an infused structure at the interface within organic substrate and changing the surface characteristics such as hydrophobicity. A hydrophobic composite overcoat with an infused structure at the interface may protect the organic substrate from the environment as an encapsulation overcoat.

Figure 11A:
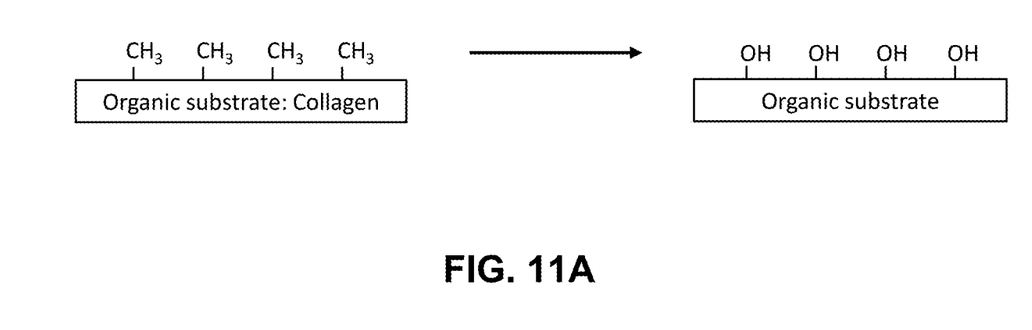
FIGS. 11A and 11B are diagrams illustrating forming an organic substrate from collagen and spraying material to afford hydrophobicity or hydrophilicity to the surface of the organic substrate, according to one embodiment.
Figure 11B:
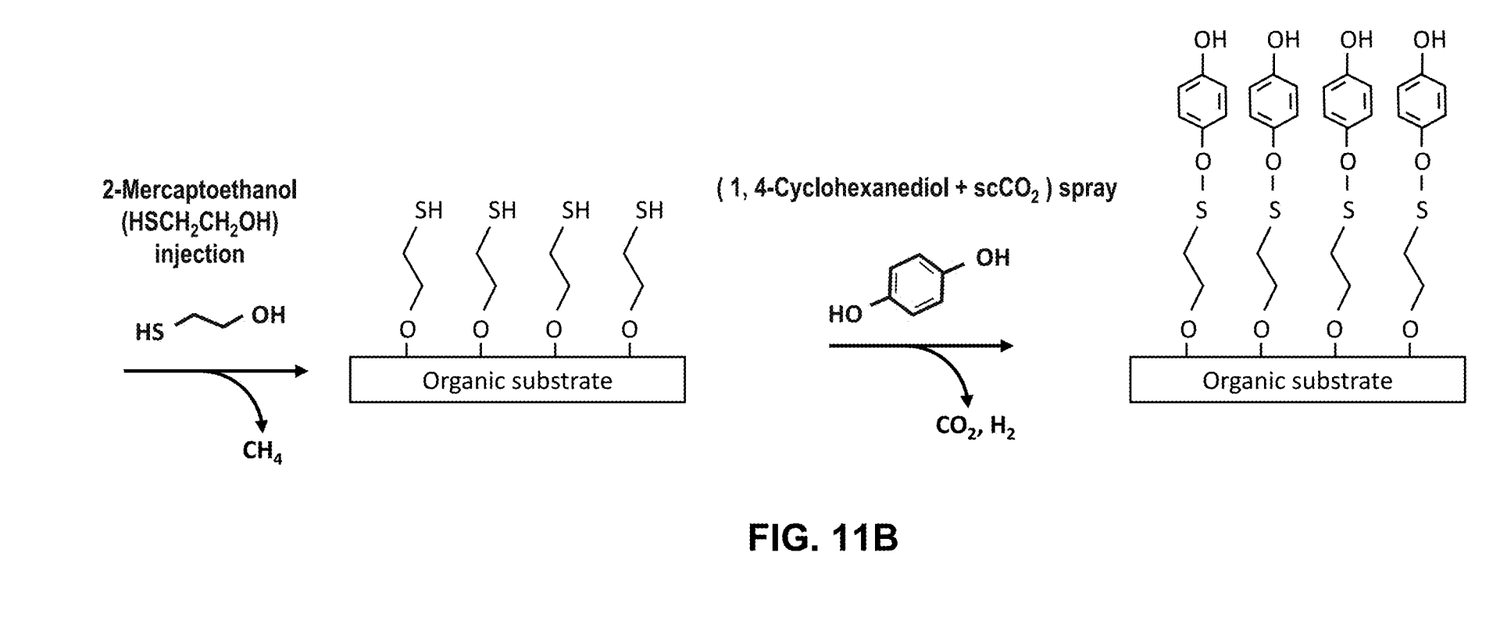

FIGS. 11A and 11B are diagrams illustrating forming of an organic substrate from collagen and spraying material to afford hydrophobicity or hydrophilicity, according to one embodiment. The processes of FIGS. 11A and 11B may be performed using the spray assembly having multiple spraying modules as described above with reference FIG. 5. The substrate is an organic material such as collagen terminated with $CH_3$. By exposing the substrate to OH* radicals, for example, the surface is terminated with OH, as shown in FIG. 11A. Then, the substrate is injected with 2-Mercaptoethanol ($HSCH_2CH_2OH$) as a heterobifuntional precursor such as mercaptoalcolhol, aminoalcohols that contain two different functional groups with common alcohol functional group (e.g., Mercaptoethanol, Thioglycolic acid, Mercaptopropanol, Mercaptophenol, Mercaptohexanol, Ethanolamines, Aminomethyl propanol, Heptaminol, Isoetarine, Propanolamines, Sphingosine, Methanolamine, Dimethylethanolamine, N-Methylethanolamine) from the spraying module 520A (that forms a surface that is hydrophobic, as shown in the left side of FIG. 11B. Subsequently, the substrate is injected with the mixture of 1,4-Cyclohexanediol (as homobifunctional precursor) and $CO_2$ supercritical fluid (as carrier gas) from the spraying module 520B to form a covalent layer-by-layer assembly on the substrate surface in the right side of FIG. 11B. Hard coating can be achieved with O* radicals or oxidative radicals generated from $N_2O$ plasma or $O_2$ plasma, or $NH_3$ plasma or reducing radicals as described in FIG. 10B.

Figure 12A:
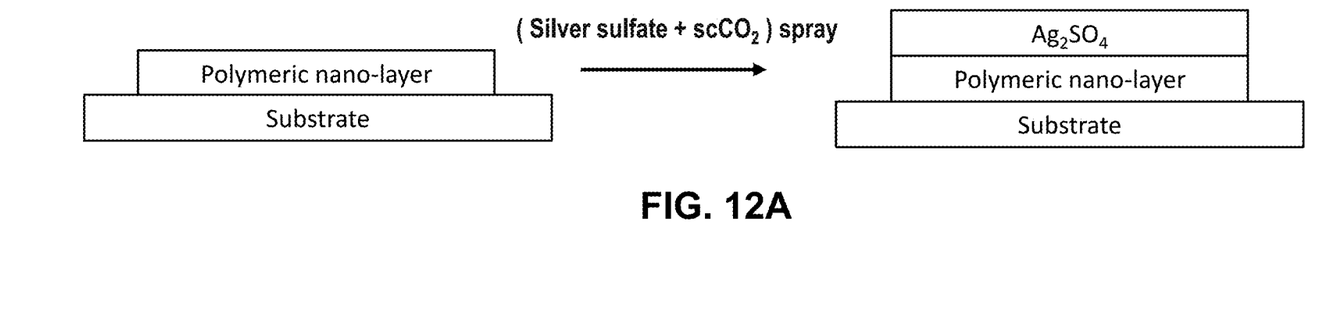
FIGS. 12A and 12B are diagrams illustrating forming a photochromic layer encapsulated with a polymeric nanolayer, according to one embodiment.
Figure 12B:
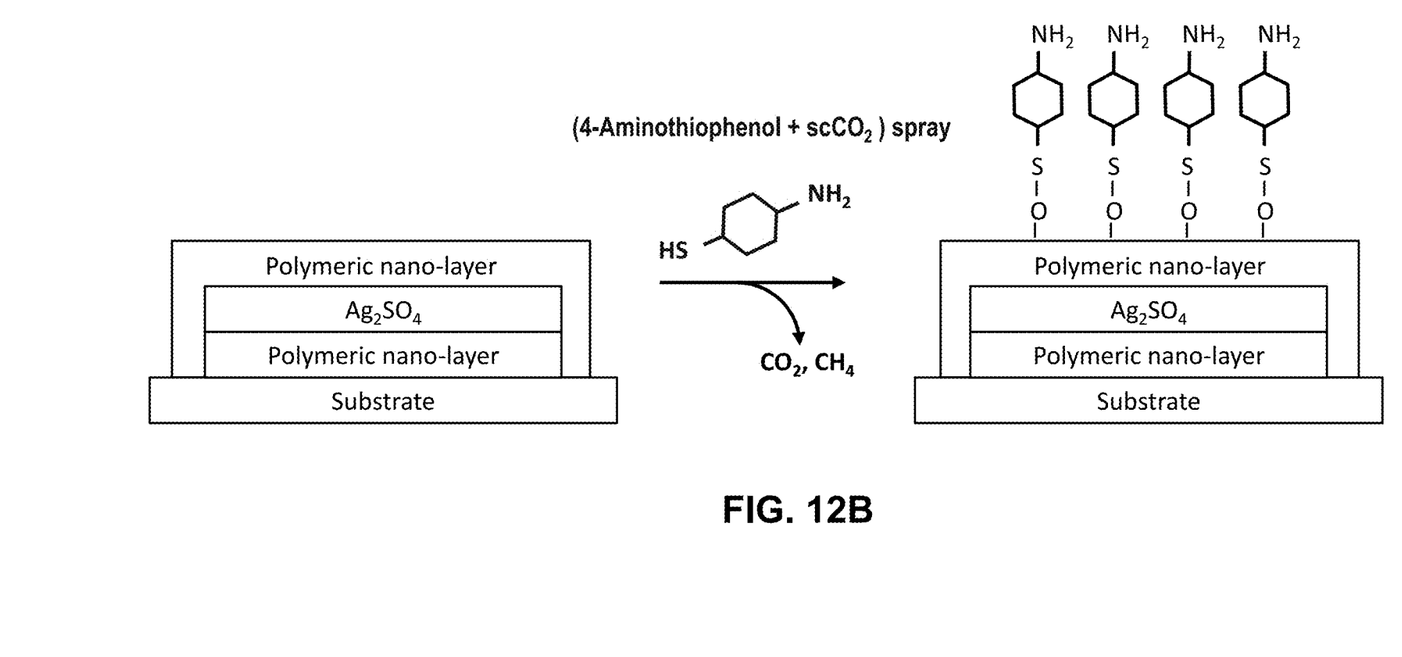

FIGS. 12A and 12B are diagrams illustrating forming of a photochromic layer encapsulated with polymeric nano-layers, according to one embodiment. The left side of FIG. 12A illustrates a polymeric nano-layer (e.g., polyimide or Nylon) formed on the substrate by spraying a mixture of polymeric material and supercritical carrier fluid.

The substrate deposited with the polymeric nano-layer is then sprayed with a mixture of silver sulfate and supercritical carrier fluid (e.g., $CO_2$) to form a photochromic layer of $Ag_2SO_4$ on the polymeric nano-layer. As shown in FIG. 10B, another layer of polymeric nano-layer may be deposited over the photochromic layer by spraying a mixture of polymeric material and supercritical carrier fluid. Subsequently, a mixture of 4-Aminothiophenol and the supercritical fluid may be injected on the substrate to encapsulate the upper polymeric nano-layer (having thickness of 10 nm to 100 nm) with $N_2O$ plasma or $NH_3$ plasma to overcoat a composite overcoat, such as highly packed hydrophobic organic layer(s), onto the upper polymeric nano-layer. During the spraying process, impregnation of an organic precursor to fill the micro-defects existing in the upper polymeric nano-layer and infiltration of the source precursor to infiltrate and react beneath the outer surface may be performed to form a new chemical structure or covalent organic-inorganic bonds within the upper polymeric nano-layer. Not only impregnation of the organic precursor, but also infiltration of the source precursor into the polymeric nano-layer from the precursor, and a crosslinking process enhanced by active species of the plasma results in a new composite overcoat having structural integrity with hydrophocity.

Although the present invention has been described above with respect to several embodiments, various modifications can be made within the scope of the disclosure. Accordingly, the disclosure described above is intended to be illustrative, but not limiting.

The invention claimed is:

1. A method for forming a layer of material on a substrate, the method comprising:
spraying, by a spraying module, a first mixture of a precursor for the material and a carrier fluid onto a first portion of the substrate, wherein the carrier fluid is in a supercritical fluid state in the spraying module, and the carrier fluid transitions to a gas state outside the spraying module, the carrier gas traveling outside the spraying module to the substrate in the gas state;
after spraying the first mixture, changing a height of the spraying module relative to the substrate or a height of a plasma reactor relative to the substrate by using an actuator that moves the spraying module or the plasma reactor;
after changing the height of the spraying module relative to the substrate or the changed height of the plasma reactor relative to the substrate, injecting a spread gas through a passage between the spraying module and a plasma reactor, the spread gas divided into a first portion and a second portion, an amount of the first portion of the spread gas entering the plasma reactor and an amount of the second portion of the spread gas entering the spraying module controlled by the changed height of the spraying module relative to the substrate or the changed height of the plasma reactor relative to the substrate;
spraying, by a spraying module, a second mixture of the precursor for the material and the carrier fluid onto a second portion of the substrate, wherein the carrier fluid is in the supercritical fluid state in the spraying module, and the carrier fluid transitions to the gas state outside the spraying module, the carrier gas traveling outside the spraying module to the substrate in the gas state;
generating, by the plasma reactor, first radicals and active species using the first portion of the spread gas of the changed amount;
separating, using the second portion of the spread gas of the changed amount, the first radicals and the second mixture of the precursor and the carrier fluid sprayed by the spraying module; and
forming the layer of the material by exposing the portion of the substrate sprayed with the mixture to the first radicals and active species.

2. The method of claim 1, further comprising exposing the substrate to second radicals to pre-treat the substrate before spraying the first or second mixture onto the substrate.

3. The method of claim 1, wherein the substrate is placed in atmospheric pressure during the spraying of the first mixture and second mixture and exposure of the substrate to the radicals.

4. The method of claim 1, wherein the carrier fluid is one of carbon dioxide ($CO_2$), Ethane ($C_2H_6$), Propane ($C_3H_8$), Ethylene ($C_2H_4$), Propylene ($C_3H_6$), Ethanol ($C_2H_5OH$), and Acetone ($C_3H_6O$).

5. The method of claim 1, further comprising spraying, by another spraying module adjacent to the spraying module, another mixture of another precursor and another carrier fluid onto the substrate.

6. The method of claim 1, wherein the spread gas is $N_2$, Ar, $N_2O$, $H_2$, $O_2$, $CO_2$, $O_3$, $NH_3$ or a combination thereof.

7. The method of claim 1, further comprising causing relative motion between the spraying module and the plasma reactor to spray the first or second mixture to different portions of the substrate, and to expose the different portions of the substrate to the first radicals.

8. The method of claim 1, further comprising discharging, through an exhaust, at least a portion of remaining portion of the first or second mixture after spraying the first or second mixture to the substrate in the spraying module.

9. The method of claim 1, wherein the substrate is an inorganic material or organic material.

10. The method of claim 1, wherein the precursor is one of homobifunctional precursors from diol precursors, dithiol precursors, or one of heterobifunctional precursors having amine-, hydroxyl-, mercapto-, alkyl-, halide functional groups.

11. The method of claim 1, wherein the precursor is one of trimethylaluminum, dimethylzinc, trimethylgalium, trimethylindium, tertdimethylaminozirconium, trisilylamine, and tertdimethylaminotitanium.

12. The method of claim 1, wherein the amount of the first portion of the spread gas and the amount of the second portion of the spread gas are further controlled by:
changing a width of a wall of the spraying module or a width of a wall of the plasma reactor.

* * * * *